United States Patent
Goyhenetche et al.

(10) Patent No.: US 6,469,567 B1
(45) Date of Patent: Oct. 22, 2002

(54) POWER SUPPLY CIRCUIT AND METHOD

(75) Inventors: Philippe Goyhenetche, Fonsorbes (FR); Dominique Omet, Toulouse cedex (FR); Christophe Basso, Toulouse Cedex (FR)

(73) Assignee: Semiconductor Components Industries LLC, Phoenix, AZ (US)

( * ) Notice: Subject to any disclaimer, the term of this patent is extended or adjusted under 35 U.S.C. 154(b) by 0 days.

(21) Appl. No.: 09/821,988

(22) Filed: Apr. 2, 2001

(51) Int. Cl.[7] .............................................. H03K 17/16
(52) U.S. Cl. ..................... 327/390; 327/589; 327/538
(58) Field of Search ................................ 327/535, 390, 327/589, 530, 536, 540, 542, 306, 331, 322; 363/59

(56) References Cited

U.S. PATENT DOCUMENTS

| | | | | |
|---|---|---|---|---|
| 5,388,084 A | * | 2/1995 | Itoh et al. | 365/226 |
| 5,499,183 A | * | 3/1996 | Kobatake | 363/59 |
| 6,297,687 B1 | * | 10/2001 | Sugimura | 327/536 |

* cited by examiner

*Primary Examiner*—Tuan T. Lam
*Assistant Examiner*—Hiep Nguyen
(74) *Attorney, Agent, or Firm*—James J. Stipanuk

(57) ABSTRACT

An integrated switching mode power supply (10) has a follower device (59) providing a supply voltage ($V_{BOOT}$) to a node (70) of the power supply. A driver circuit operates in response to an input signal ($V_{CONTROL}$) and has an output (40) for providing a drive signal ($V_{DRIVE}$) that bootstraps the node to a potential greater than the supply voltage.

19 Claims, 2 Drawing Sheets

POWER SUPPLY CIRCUIT AND METHOD

BACKGROUND OF THE INVENTION

The present invention relates in general to semiconductor devices and, more particularly, to switch mode power supplies used in battery chargers.

The global nature of technology creates a demand for "universal" devices that can operate in most if not all countries. For example, portable devices such as notebook computers and digital cameras can operate in multiple countries because they are powered from batteries rather than a local alternating current (AC) power source. However, the battery chargers used to recharge the batteries do operate from a local AC power source, and therefore often do not operate in multiple countries due to different AC power standards. Worldwide, AC power is provided at a voltage level ranging from about eighty volts root mean square (RMS) to about three hundred sixty volts RMS.

A battery charger typically includes a power supply whose integrated circuits and other electrical components process the incoming AC power to produce a direct current (DC) supply voltage for charging a battery. However, many of the power supplies' components cannot function over the necessary voltage range. A charger configured to operate at two hundred volts RMS may incur damage if used in a country providing three hundred volts RMS. On the other hand, if the AC power provides only eighty volts RMS, the components may not receive enough voltage to function correctly, which can damage the battery.

Most previous power supplies function over a limited voltage range, and therefore can operate in only one country. Chargers using these power supplies have a high cost because manufactures use different designs and/or components for each country, thereby losing the economy of scale. Other battery chargers can operate in multiple locations but require external controls such as user-operated switches to select an AC voltage appropriate for the location. Such chargers have lower design costs but are susceptible to damage if a user inadvertently selects the wrong voltage level. The external controls are inconvenient for the user and also increase the component count, which increases the fabrication cost of the charger.

Hence, there is a need for a circuit and method of providing a supply voltage which can operate from a wide range of supply voltages without incurring damage while reducing the manufacturing cost by reducing the number of external user controls.

DETAILED DESCRIPTION OF THE DRAWINGS

In the figures, elements having the same reference numbers have similar functionality.

Figure 1:
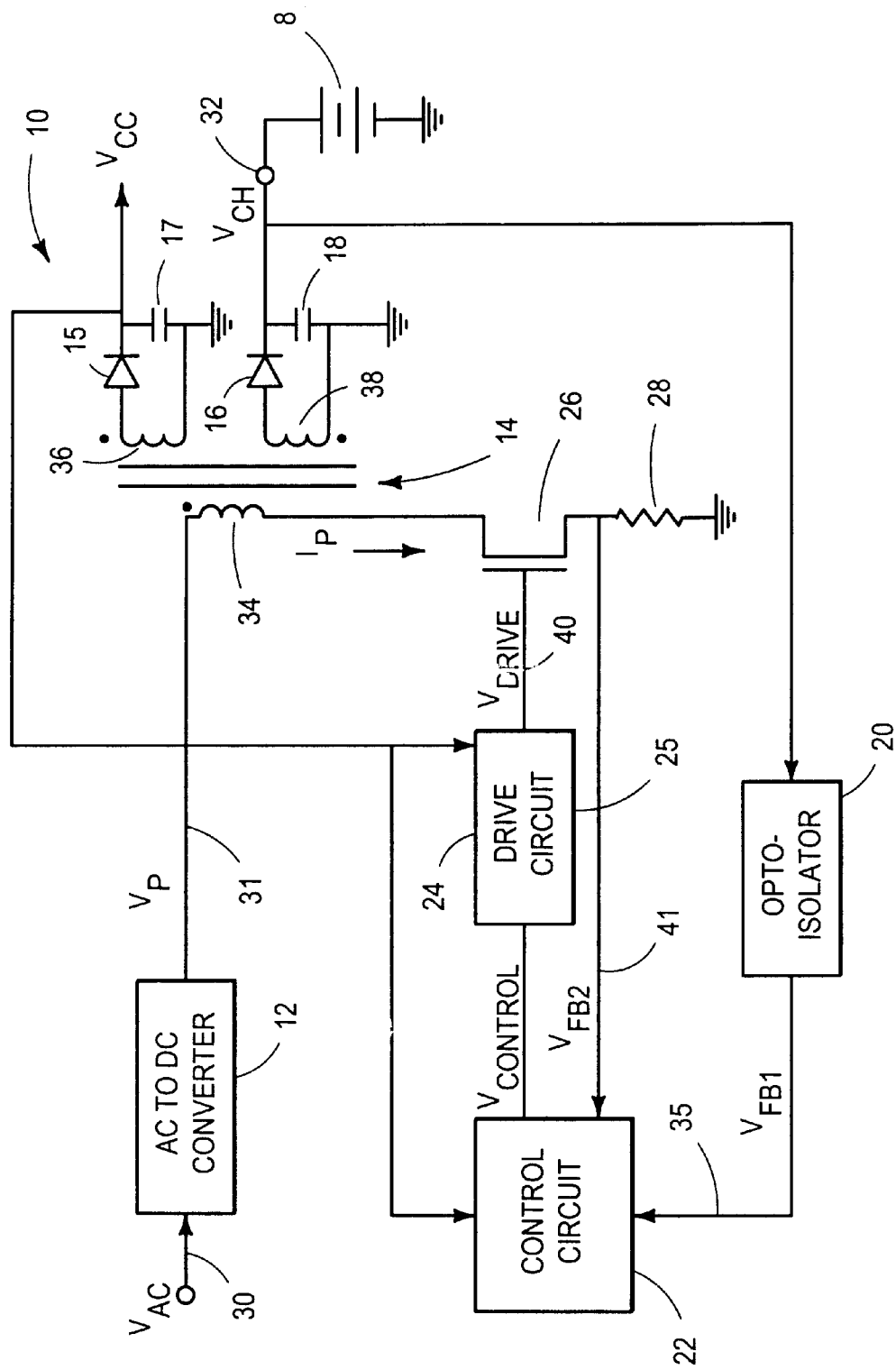
FIG. 1 is a schematic diagram of a battery charger.

FIG. 1 is a schematic diagram of a battery charger 10 coupled for charging a battery 8. Battery charger 10 includes an alternating current (AC) to direct current (DC) converter 12, a transformer 14, diodes 15–16, capacitors 17–18, an optoisolator 20, a control circuit 22, a drive circuit 24, a transistor 26 and a resistor 28. Battery charger 10 functions as a power supply which has a terminal 30 for coupling to a wall outlet (not shown) to receive operating power from a power source designated as AC voltage $V_{AC}$. Depending on a country's local power standards, voltage $V_{AC}$ can have a value ranging from about eighty volts root-mean-square (RMS) to about three hundred sixty volts RMS at a frequency from fifty to sixty hertz. This range incorporates most if not all of the power standards in effect worldwide so that battery charger 10 is considered to be a "universal" battery charger. An output terminal 32 provides a DC charging voltage $V_{CH}$ for recharging battery 8.

Converter 12 has an input coupled to terminal 30 for receiving AC voltage $V_{AC}$ and an output coupled to a node 31 for providing a DC voltage $V_P$. Converter 12 includes a standard diode bridge network and a filter capacitor for producing voltage $V_P$ as a rectified and filtered voltage. Voltage $V_P$ essentially operates at a peak value of voltage $V_{AC}$, and therefore ranges from about one hundred ten volts to over five hundred volts in accordance with the range of voltage $V_{AC}$.

Transformer 14 has a primary winding 34, a secondary forward winding 36 and a secondary flyback winding 38. A switched current $I_P$ flows through primary winding 34 as transistor 26 switches. Current $I_P$ induces AC voltages $V_{S1}$, and $V_{S2}$ across secondary windings 36 and 38, respectively. Voltages $V_{S1}$ and $V_{S2}$ are rectified by diodes 15–16 and filtered by capacitors 17–18 to produce rectified and filtered DC signals $V_{CH}$ and $V_{CC}$ on terminals or nodes 32 and 33, respectively. Voltage $VS_1$, has a value determined by the turns ratio of secondary winding 36 to primary winding 34, and therefore has a range as broad as that of AC voltage VAC. In one embodiment, voltage $V_{S1}$, has a value between about eight volts and about forty volts.

Signal $V_{S1}$, is in phase with primary voltage $V_P$, while signal $V_{S2}$ is out of phase, so diodes 15 and 16 are forward biased, and therefore conduct, on alternate cycles. That is, when voltage $V_s$, is positive to forward bias diode 15, voltage $V_{S2}$ is negative to reverse bias diode 16, and vice versa. Hence, when transistor 26 turns on and current $I_P$ flows through primary winding 34, an induced current flows through forward winding 36 but not flyback winding 38. When transistor 26 turns off, $I_P$ is zero and no current flows through forward winding 36, but energy stored in primary winding 34 on the previous cycle induces a current flow in flyback winding 38. In effect, energy is transferred to forward winding 36 when transistor 26 is on and to flyback winding 38 when transistor 26 turns off. Since voltage $V_{CC}$ provides the supply voltage for control circuit 22 and drive circuit 24, the opposing phase relationship of secondary windings 36 and 38 ensures that the value of $V_{CC}$ is substantially unaffected by a high current flowing through node 32. As a result, battery charger 10 continues to function properly even if a high current from a shorted or discharged battery forces node 32 near ground potential.

Voltage $V_{S2}$ is a regulated voltage whose value is set by the type of battery which battery charger 10 is designed to recharge. Regulation is achieved by a feedback loop from node 32 through optoisolator 20 to a node 35 at an input of control circuit 22. Optoisolator 20 includes a light emitting diode and a phototransistor for optically coupling information regarding the level of voltage $V_{S2}$ from node 32 to a node 35 as feedback signal $V_{FB}$. Voltage $V_{S2}$ has a value ranging from about six volts to about nine volts, depending on the type of battery being recharged. In one embodiment, voltage $V_{S2}$ is regulated at six volts. In accordance with safety standards, optoisolator 20 provides at least four thousand volts of electrical isolation between nodes 32 and 35 to achieve safe operation of battery charger 10.

Control circuit 22 comprises a microcontroller that is programmed to control the recharging cycle of a battery. A first feedback input receives feedback signal $V_{FB1}$ on node 35 to indicate the level of charging voltage $V_{CH}$. Control circuit 22 includes circuitry to generate a first reference signal and a first comparator for comparing $V_{FB1}$ to the first reference signal. The result of the comparison is processed to produce a pulse width modulated control signal $V_{CONTROL}$ at an output at a node 39 to maintain voltage $V_{S2}$ at the desired amplitude. A second feedback input is coupled to a node 41 to receive feedback signal $V_{FB2}$, which indicates the current flow through transistor 26 and resistor 28. Control circuit 22 further includes circuitry to generate a second reference signal and a second comparator for comparing the second reference to $V_{FB2}$. When the current flowing through resistor 28 reaches a predetermined level, a pulse of $V_{CONTROL}$ may be truncated to limit the current flowing through transistor 26.

Drive circuit 24 operates as an amplifier that has an input coupled to node 39 for receiving $V_{CONTROL}$ pulses and an output at a node 40 for producing a drive signal $V_{DRIVE}$. The component pulses of drive signal $V_{DRIVE}$ swing from a low logic level of approximately zero volts to a high logic level of between 7.2 and fifteen volts. A supply terminal operates from voltage $V_{CC}$, which ranges between about eight and about forty volts. In one embodiment, drive circuit 24 is formed on an integrated circuit substrate for housing in a semiconductor package 25.

Transistor 26 is configured as an n-channel enhancement mode metal-oxide-semiconductor field effect transistor (MOSFET). Drive signal $V_{DRIVE}$ is coupled to the gate of transistor 26 for switching current through primary winding 34. The gate electrode has a breakdown voltage of twenty volts or less, so it is necessary that $V_{DRIVE}$ pulses be limited to a lower amplitude. Transistor 26 is configured as a high current device and therefore has a high effective gate capacitance. In one embodiment, the gate capacitance is at least one nanofarad.

Current through transistor 26 develops a voltage $V_{FB2}$ across resistor 28 which is fed back to control circuit 22 to set a current limit through transistor 26. In one embodiment, resistor 28 has a value of one ohm to set a maximum current through transistor 26 of two-hundred fifty milliamperes.

Figure 2:
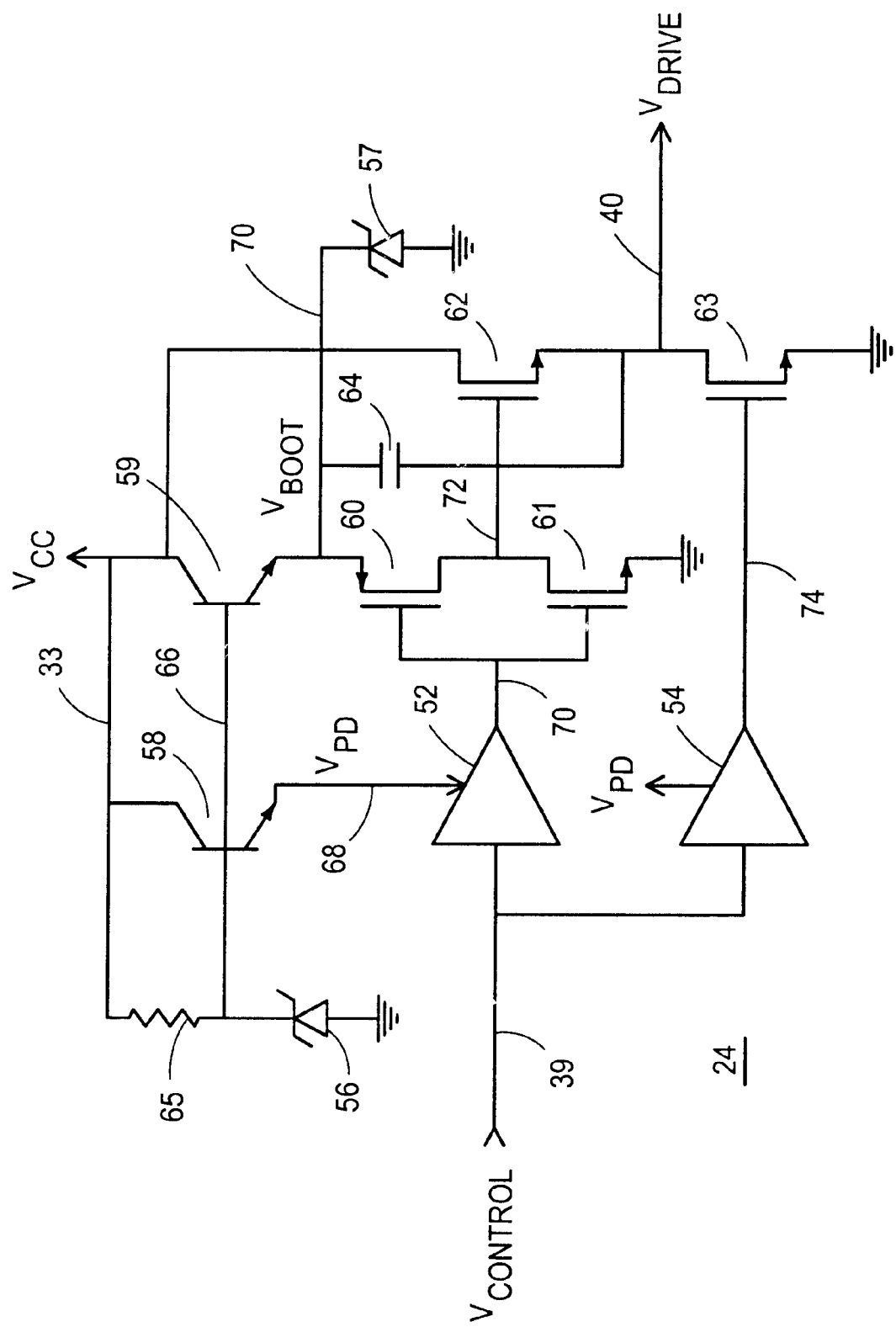
FIG. 2 is a schematic diagram of a driver circuit of the battery charger.

FIG. 2 is a schematic diagram showing drive circuit 24 in further detail, including predrivers 52 and 54, diodes 56–57, transistors 58–63, a capacitor 64 and a resistor 65. Drive circuit 24 operates as a push-pull amplifier receiving control signal $V_{CONTROL}$ at node 39 and producing drive signal $V_{DRIVE}$ at node 40. Operating power is supplied by voltage $V_{CC}$ at node 33.

Diode 56 is configured as an avalanche diode that avalanches or breaks down when voltage $V_{CC}$ is greater than about ten volts. The avalanching clamps the potential on a node 66 at ten volts to avoid subjecting low voltage components of drive circuit 24 to high voltage damage. The low voltage components operate from internal supply voltages $V_{PD}$ and $V_{BOOT}$ which are derived from the node 66 potential and produced at the emitters of transistors 58–59. $V_{PD}$ and $V_{BOOT}$ have a value of about 7.2 volts when $V_{CC}$ is eight volts, increasing to about 9.2 volts when $V_{CC}$ is ten volts and clamped at 9.2 volts when $V_{CC}$ is greater than ten volts. By clamping $V_{PD}$ and $V_{BOOT}$ at 9.2 volts, components of drive circuit 24 can be made smaller, which reduces the die size and manufacturing cost.

Resistor 65 is selected to provide about one microamperes of base current to transistors 58–59 and about nine microamperes of breakdown current through diode 56 when $V_{CC}$ operates at eight volts. When $V_{CC}$ has a higher value, additional current is shunted through diode 56.

Transistors 58–59 comprise NPN bipolar transistors operate as follower devices or emitter followers to provide VPD and $V_{BOOT}$ on nodes 68 and 70, respectively, with a low emitter impedance. In one embodiment, transistor 59 has a base-emitter breakdown of about eight volts. Alternatively, transistors 58–59 may be MOSFETs operating as source followers.

Predrivers 52 and 54 operate as amplifiers that boost the current capability of $V_{CONTROL}$ pulses so that drive signal $V_{DRIVE}$ has fast switching transitions when driving the high gate capacitance of transistor 26. Transistors 60–61 function as an inverter stage so that the gates of transistors 62–63 are driven with opposite polarities. That is, the signal at the gate of transistor 62 has the opposite polarity as the signal at the gate of transistor 63 to ensure that transistor 62 is turned on when transistor 63 is turned off, and vice versa.

Transistors 62–63 comprise n-channel MOSFETS coupled to function as a push-pull output stage. Transistors 62–63 have conduction thresholds of about one volt and are selected to have a size adequate to drive the capacitance of transistor 26 while switching with a short transition time. Transistors 62–63 have relatively thin gate oxides which are specified to break down if the voltages on their respective gates exceeds eighteen volts. To further reduce positive $V_{DRIVE}$ voltage transitions, the drive signal of transistor 62 is bootstrapped with capacitor 64.

The operation of the output stage is described as follows. Assume that $V_{CC}$ is greater than ten volts, so the potential of node 66 is clamped at ten volts. Voltages $V_{PD}$ and $V_{BOOT}$ initially operate at about 9.2 volts. Further assume that $V_{CONTROL}$ is logic high, so nodes 70 and 74 are driven to a potential of about 9.2 volts and node 72 is at ground potential. Hence, transistor 63 is turned on while transistor 62 is turned off. Drive voltage $V_{DRIVE}$ is at ground potential, charging capacitor 64 through transistors 59 and 63 to a potential of about 9.2 volts. In one embodiment, capacitor 64 has a capacitance of ten picofarads.

When $V_{CONTROL}$ goes to a logic low, node 74 is at ground potential to turn off transistor 63 and turn on transistor 60.

As the potential of node 72 increases to about one volt, transistor 62 turns on to pull node 40 high to begin a positive $V_{DRIVE}$ transition. The charge on capacitor 64 causes $V_{BOOT}$ to rise, turning off transistor 59 by reverse biasing its base-emitter junction. Node 72 is pulled more positive through transistor 60, which increases the gate drive of transistor 62 to reduce the positive going transition time of $V_{DRIVE}$ Diode 57 is selected to have an avalanche or 35 breakdown voltage of fifteen volts in order to avoid breaking down the emitter-base junction of transistor 59. Hence, during a positive transition, as $V_{BOOT}$ rises above its 9.2 volt level to fifteen volts, diode 57 avalanches, discharging capacitor 64 and clamping the potential of node 70. This clamping effectively limits the reverse bias of the emitter-base junction of transistor 59 to about five volts, thereby avoiding a damaging breakdown of transistor 59. Clamping has the further advantage of protecting the gate of transistor 62 from a thin oxide breakdown. Clamping further limits the positive swing of $V_{DRIVE}$ to about fourteen volts to avoid and excessive voltage that could damage transistor 26. Note that the avalanche current through diode 57 is effectively limited to the discharging current of capacitor 64. Hence, no direct current flows through diode 57, so drive circuit 24 operates at a low power.

When $V_{CONROL}$ goes to a logic high, node 70 is at a potential of about 9.2 volts, turning on transistor 61 and pulling node 72 to ground potential to turn off transistor 62. Node 74 is at a potential of 9.2 volts, which turns on transistor 63 and drives $V_{DRIVE}$ to ground potential. Transistor 59 turns on as $V_{BOOT}$ is pulled down through capacitor 64 and its low emitter impedance maintains node 70 at a potential of 9.2 volts. Capacitor 64 is charged to 9.2 volts through transistors 59 and 63 to end the cycle.

During standard operation, transistor 59 has a low emitter impedance to maintain node 66 at a constant potential for reducing switching noise. During bootstrap operation, the emitter-base junction of transistor 59 reverse biases to provide a high impedance to allow charge stored on capacitor 64 to turn off transistor 59 and bootstrap node 70 to a voltage higher than 9.2 volts.

By now it should be appreciated that the present invention provides an integrated switching power supply circuit with fast switching transitions and a wide operating voltage range. A follower device provides a supply voltage to a node of the power supply circuit, and a driver circuit operates in response to an input signal to providing a drive signal that bootstraps the node above the supply voltage. A clamping device limits the value and range of the potential on the node to reduce component size and prevent damage to power supply components.

What is claimed is:

1. An integrated circuit (24), comprising:
   a follower device (59) coupled for providing a supply voltage ($V_{BOOT}$) to a node (70) of the integrated circuit;
   an inverter coupled to the node to operate from the supply voltage and having an input for receiving an input signal; and
   a driver circuit (62, 63) having an input coupled to an output of the inverter and an output (40) for providing a drive signal ($V_{DRIVE}$) that bootstraps the node to a potential greater than the supply voltage.

2. The integrated circuit of claim 1, further comprising a capacitor coupled between the node and the output of the drive circuit.

3. The integrated circuit of claim 2, wherein the follower device comprises a transistor having a conduction electrode coupled to the node, and a charge on the capacitor turns off the transistor as the drive signal increases.

4. The integrated circuit of claim 3, wherein the transistor has a control electrode coupled to a supply terminal of the integrated circuit, further comprising a diode coupled to the supply terminal for limiting the supply voltage.

5. The integrated circuit of claim 4, wherein the transistor is a bipolar transistor having an emitter coupled to the node and a base coupled to the supply terminal.

6. The integrated circuit of claim 1, further comprising a clamping device that breaks down to limit a potential on the node to a predefined level.

7. The integrated circuit of claim 6, wherein the clamping device comprises a first diode coupled between the node and a supply terminal of the integrated circuit.

8. The integrated circuit of claim 7, wherein the first diode is an avalanche diode.

9. The integrated circuit of claim 1, wherein the driver circuit includes a first transistor having a conduction electrode coupled to the output and a control electrode coupled to the node.

10. The integrated circuit of claim 1, further comprising a semiconductor package for housing the driver circuit and the follower device.

11. A power supply comprising:
    a follower device coupled to a node to provide a supply voltage;
    an inverter operating from the supply voltage and having an input for receiving an input signal and an output for providing an inverted signal;
    a driver (24) having an input coupled for receiving the inverted signal (39) and an output ($V_{CONTROL}$) for producing an output signal (40);
    a capacitor (64) coupled to the node for bootstrapping the node with the output signal; and
    a first diode (57) coupled to the node for breaking down to limit a magnitude of the output signal.

12. The power supply of claim 11, wherein the first diode has an anode coupled to a terminal of the power supply and an cathode coupled to the node.

13. The power supply of claim 11, further comprising a follower device for providing a supply voltage to the node.

14. The power supply of claim 13, further comprising a second diode having a cathode coupled to a control electrode of the follower device and an anode coupled to the terminal of the power supply.

15. A method of amplifying, comprising the steps of:
    providing a supply voltage ($V_{BOOT}$) to a node (70) with a follower device;
    supplying an inverter with the supply voltage for inverting an input signal ($V_{CONTROL}$) to produce an inverted signal; and
    switching a driver circuit (62, 63) with the inverted signal to produce a drive signal ($V_{DRIVE}$) that bootstraps the node to a potential greater than the supply voltage.

16. The method of claim 15, wherein the step of switching includes the step of charging a capacitance with the drive signal.

17. The method of claim 16, wherein the step of switching further includes the step of turning off the follower device with the capacitance.

18. The method of claim 16, further including the step of avalanching a diode (57) to discharge the capacitance.

19. The method of claim 15, further comprising the step of switching a coil current ($I_P$) with the drive signal.

* * * * *